(12) United States Patent
Ruyters et al.

(10) Patent No.: US 6,462,108 B1
(45) Date of Patent: Oct. 8, 2002

(54) HIGH TG POTTING COMPOUND

(75) Inventors: Michel Ruyters, Tessenderlo (BE); Neil Carpenter, Zaventem (BE); Roseann Schultz, Westford, MA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 75 days.

(21) Appl. No.: 09/620,170

(22) Filed: Jul. 20, 2000

(51) Int. Cl.$^7$ .............................. C08K 3/08; C08L 63/02
(52) U.S. Cl. ...................... 523/457; 523/458; 523/459; 523/468; 528/103; 528/103.5; 528/113
(58) Field of Search ................................ 523/435, 457, 523/458, 459, 468; 518/103, 103.5, 113

(56) References Cited

U.S. PATENT DOCUMENTS

| | | | |
|---|---|---|---|
| 4,999,699 A | 3/1991 | Christie et al. ............... 357/65 |
| 5,045,609 A | 9/1991 | Lee et al. .................... 525/438 |
| 5,155,066 A | 10/1992 | Nguyen ....................... 437/209 |
| 5,195,299 A | 3/1993 | Nguyen ....................... 53/428 |
| 5,276,073 A | * 1/1994 | Akutagawa ................. 523/440 |

OTHER PUBLICATIONS

Registry File Printout, American Chem. Soc, 2001.*
"Cycloaliphatic Epoxide Systems", *Union Carbide*.

* cited by examiner

*Primary Examiner*—Robert Dawson
*Assistant Examiner*—D. Aylward
(74) *Attorney, Agent, or Firm*—Charles W. Almer

(57) ABSTRACT

A liquid epoxy-based potting composition has a glass transition temperature equal to or greater than 200° C. and comprises a cyclo-aliphatic epoxy, present in an amount of 50 to 80 parts by weight; a multi-functional aromatic epoxy (having more than two epoxy groups per molecule), present in an amount of 20 to 50 parts by weight; a liquid anhydride, present in an amount of 80 to 150 parts by weight; a basic latent accelerator, present in an amount of 1 to 5 parts by weight; and a filler, present in an amount of 100 to 500 parts by weight.

6 Claims, No Drawings

HIGH TG POTTING COMPOUND

FIELD OF THE INVENTION

This invention relates to epoxy based compounds, capable of withstanding high service temperatures, and suitable for use as encapsulants or potting compounds.

BACKGROUND OF THE INVENTION

Many electronic devices are used in applications in which the service temperatures are as high as 180° C., such as in under-the-hood automotive applications. These electronic devices are encapsulated or potted in organic materials that must be able to withstand these temperatures. In addition, the materials must have a low coefficient of thermal expansion (CTE), as the temperature imposed on the device fluctuates from ambient seasonal temperatures to the high service temperatures. Repeated thermal cycling at such variant temperatures could cause failure of the device if the CTE is not sufficiently low.

Favored compounds for these uses are epoxy compounds. Typically, it is possible to achieve a low CTE by adding fillers to the potting or encapsulant composition. However, classic epoxy formulations use solid or highly viscous multifunctional resins in order to attain a high Tg, and these compounds do not have a sufficiently low viscosity to allow the addition of enough filler to achieve as low a CTE as is needed for under-the-hood applications. Diluents can be added to the composition to lower the viscosity, but this in turn prevents attaining high Tg values.

Thus, there is a need for liquid potting or encapsulant compositions that permit the addition of a high volume of filler without the addition of diluent, and without the loss of high Tg values.

SUMMARY OF THE INVENTION

This invention is a liquid epoxy-based potting composition which upon cure produces a solid compound having a glass transition temperature equal to or greater than 200° C., a coefficient of linear thermal expansion equal to or lower than $25 \times 10^{-6}$ $K^{-1}$, and a viscosity within the range of 25 to 40 Pa.s. The epoxy composition comprises a cyclo-aliphatic epoxy, present in an amount of 50 to 80 parts by weight; a multi-functional aromatic epoxy (having more than two epoxy groups per molecule) present in an amount of 20 to 50 parts by weight; a liquid anhydride, present in an amount of 80 to 150 parts by weight; a basic latent accelerator, present in an amount of 1 to 5 parts by weight; and a filler, present in an amount of 100 to 500 parts by weight. Either the cycloaliphatic epoxy or the multifunctional aromatic epoxy will be a liquid, so that the filled composition will have a viscosity within the range stated above. The equivalent ratio of anhydride to epoxy will be in the range of 0.8–1.2.

Cycloaliphatic epoxy resins that can be used in the potting composition include 3,4-epoxycyclohexylmethyl-3,4-epoxycyclohexane carboxylate (Union Carbide, ERL-4221), (Vantico Araldite® CY-179) (both liquids); bis(3,4 epoxycyclohexylmethyl) adipate (Union Carbide, ERL-4299)(liquid); and 1,2-epoxy-4-(2oxiranyl)-cyclohexane with 2,2-bis(hydroxymethyl)-1-butanol (Daicel Chemical Industries, Daicel® EHPE 3180) (solid).

Multifunctional aromatic epoxy resins that are suitable for use in the potting composition include, but are not limited to, 2,6-(2,3-epoxypropyl)phenylglycidyl ether (proprietary to National Starch and Chemical) (liquid); polyglycidyl ethers of phenol-formaldehyde novolac resins (such as that sold by CVC Chemicals as Epalloy® 8240); tetraglycidyl 4,4'-diamino diphenyl methane (Vantico, Araldite® MY-720); condensation products of 1,2 epoxy 4 (2-oxiranyl) cyclohexane with 2,2-bis(hydroxy methyl)-1-butanol (Daicel Chemical Industries, Daicel® EHPE 3180) (solid).

Useful anhydrides include liquid cycloaliphatic polyanhydrides or mixtures thereof, such as methylhexahydrophtalic anhydride(MHHPA), methyltetrahydrophtalic anhydride (MTHPA), and methyl-endomethylene tetrahydrophtalic anhydride (NMA).

Suitable accelerators include imidazoles, and the reaction products of diglycidyl ether of bisphenol A with polyamines (Ajinimoto, Ajicure® MY-24) or with imidazoles (Ajinimoto, Ajicure® PN-23).

Suitable fillers can be thermally or electrically conductive or nonconductive. Exemplary conductive fillers include carbon black, graphite, gold, silver, copper, platinum, palladium, nickel, aluminum, silicon carbide, boron nitride, diamond, and alumina. Exemplary nonconductive fillers include particles of vermiculite, mica, wollastonite, calcium carbonate, titania, sand, glass, fused silica, fumed silica, barium sulfate, and halogenated ethylene polymers, such as tetrafluoroethylene, trifluoroethylene, vinylidene fluoride, vinyl fluoride, vinylidene chloride, vinyl chloride, and aluminum and magnesium hydrates.

EXAMPLES

In these examples, sample formulations were prepared and evaluated for Tg (glass transition temperature) and cure profile. The formulations were prepared by blending the ingredients at room temperature in a vacuum high speed dissolver mixer and subsequently degassing the mixture. The components of the formulations are set out in the following tables with the respective Tg values, and time and temperature to cure.

Example 1

The formulations in this example contained a cycloaliphatic epoxy, 3,4-epoxycyclo-hexylmethyl-3, 4epoxy-cyclohexane carboxylate, available from Union Carbide under the tradename ERL-4221 (identified in the table as ERL-4221), and multifunctional aromatic epoxy. The aromatic epoxy was either a bifunctional low viscosity bis-F-epoxy available from Dainippon Ink & Chemical under the tradename Epiclon 830S (identified in the table as 830S), or a proprietary multifunctional aromatic epoxy from National Starch and Chemical Company (identified in the table as R-1). The structures for these epoxies are given below.

The formulations also contained an acid anhydride curing agent, methylhexahydrophtalic anhydride (identified in the table as MHHPA), and as an accelerator an amine adduct commercially available from Ajinimoto as Ajicure® MY-24 (identified in the table as MY-24).

Component amounts in the formulation are given in parts by weight in Table 1.

TABLE 1

| Sample ID | A | B | C | D | E | F | G |
|---|---|---|---|---|---|---|---|
| Cycloallpha. ERL-4221 | 75 | 75 | 75 | 75 | 75 | 75 | 75 |
| 830-S | 25 | 25 | 25 | — | — | — | — |
| Multifunct. epoxy R-1 | — | — | — | 25 | 25 | 25 | 25 |
| Anhydride MHHPA | 72 | 90 | 117 | 91 | 114 | 136 | 151 |
| Accelerator MY-24 | 1,0 | 1,0 | 1,0 | 1,0 | 1,0 | 1,0 | 1,0 |
| Anhydride/epoxy ratio | 0.6 | 0. | 1.0 | 0.65 | 0.8 | 1.0 | 1.2 |
| Tg | 111 | 149 | 151 | 125 | 130 | 125 | — |
| Cure: hours/° C. | 1/150 | 1/150 | 1/150 | 2/120 | 2/120 | 2/120 | |
| Tg | 115 | 151 | 174 | 146 | 185 | 215–220 | 200–220 |
| Cure: hours/° C. | 1/150 + 4/180 | 1/150 + 4/180 | 1/150 + 4/180 | 2/120 + 12/200 | 2/120 + 12/200 | 2/120 + 12/200 | 2/120 + 12/200 |

This data show that the introduction of a multifunctional aromatic epoxy (R-1) can increase the Tg by 30 to 40° C.

Example 2

The formulations in this example contained only aromatic epoxies, and no cycloaliphatic epoxy. The aromatic epoxies used were Epalloy® 8240, a low viscosity epoxidized ortho-cresol novolac with a functionality of 2.8, sold by CVC Chemicals (identified in the table as 8240); 4,4'-diamino diphenyl methane, a tetrafunctional resin sold by Vantico as Araldite® MY-720 (identified in the table as TGDDM); and a proprietary trifunctional aromatic epoxy from National Starch and Chemical Company (identified in the table as R-1). The structures for these epoxies are given below, Some of the formulations contained methylhexahydrophtalic anhydride (identified in the table as MHHPA) as the curing agent; others contained 4,4'-diaminodiphenylsulphone (identified in the table as DADPS). DADPS is a solid and must be added in fairly high quantities, thereby increasing the overall viscosity. R-1 (a National Starch and Chemical proprietary epoxy) and trimethylol propane trigylycidyl ether (sold by Shell as Heloxy Modifier® 48, identified in the table as R-101), both trifunctional epoxies, were used as reactive diluents.

The formulations also contained as an accelerator, an amine adduct commercially available from Ajinimoto as Ajicure® MY-24 (identified in the table as MY-24).

Component amounts in the formulation are given in parts by weight in Table 2.

TABLE 2

| Sample ID | H | I | J | K | L | M | N |
|---|---|---|---|---|---|---|---|
| 8240 | 75 | 75 | | 100 | 80 | 80 | 80 |
| TGDDM | | | 100 | | | | |
| R-1 | 25 | 25 | | | | 20 | 50 |
| R-101 | | | | | 20 | | |
| Anhydride MHHPA | 96 | 120 | 134 | | | | |
| MY-24 | 1.0 | 1.0 | | | | | |
| DADPS | | | | 35 | 37 | 40 | 52 |
| Ahydride/epoxy ratio | 0.8 | 1.0 | 1.0 | | | | |
| Tg | 132 | 161 | 235–240 | 148 | 173 | 209 | 240 |
| cure: hours/° C. | 2/120 + 12/200 | 2/120 + 12/200 | 1/120 + 2/200 | 2/150 + 12/200 | 2/150 + 12/200 | 2/150 + 12/200 | 2/150 + 12/200 |

This data show it is possible to obtain a Tg of 240° C. with TGDDM with an anhydride curing agent, and with other multifunctional aromatic epoxy resins and DADPS as the curing agent; in both cases, however, the viscosity is too high for use as a potting compound.

Example 3

Sample formulation F from Example 1 was filled with wollastonite from NYCO under the tradename Nyad® 400 (identified in the table as Nyad 400) to give sample formulation O. As shown by the data in Table 3, the addition of the filler did not change the Tg, and advantageously resulted in lowering of the coefficient of thermal expansion from 67 to 28–33×10$^{-6}$K$^{-1}$. Components of the formulations are given in parts by weight.

TABLE 3-a

| Sample ID | F | O |
|---|---|---|
| ERL-4221 | 75 | 75 |
| R-1 | 25 | |
| MHHPA | 136 | 136 |
| MY-24 | 1 | 1 |
| Nyad 400 | 0 | 320 |
| Tg | 215–220 | 216–227 |
| cure: hours/° C. | 2/150 + 12/200 | 2/150 + 12/200 |
| CTE $10^{-6}K^{-1}$ | 66–67 | 26–33 |

Physical properties for Formulation O are reported here:

TABLE 3-b

| | Viscosity change (measured at 25° C.) | |
|---|---|---|
| Storage time (days) | Stored at 25° C. (Pa · s) | Stored at 6° C. (Pa · s) |
| 0 | 14.8 | 14.8 |
| 4 | 14.5 | 12.2 |
| 7 | 15.7 | 11.5 |
| 11 | 26.1 | 13.4 |
| 19 | 46.9 | 14.8 |
| 25 | 96.3 | 17.3 |

TABLE 3-c

| Water Absorption | |
|---|---|
| 24 hr/25° C. | 1 hr/100° C. |
| +0.08% | +0.05% |

TABLE 3-d

| Dielectric Constant ($\epsilon_r$) & Dissipation Factor (tan δ) | | |
|---|---|---|
| ν | $\epsilon_r$ | tan δ |
| 50 Hz | 4.6 | 0.010 |
| 1 kHz | 4.1 | 0.007 |
| 1 MHz | 3.9 | 0.012 |

TABLE 3-e

| | |
|---|---|
| Surface Resistivity (ρs): | $1.9 \times 10^{15}$ Ωcm |
| Cure shrinkage: | −1.5% |
| Thermal conductivity: | 0.48 W/mK |

Example 4

All the formulations in this Example were prepared as indicated at the beginning of the Examples section of this specification, with the exception of formulation T, in which the EHPE 3150 was dissolved into the ERL-4221 at a temperature of 80° C., with subsequent cooling to room temperature before adding the remainder of the formulation components.

In the table EHPE 3150 identifies a condensation product of 1,2-epoxy-4-(2-oxiranyl)-cyclohexane with 2,2-bis (hydroxy methyl)-1-butanol; Bis-F identifies a bis-F phenol epoxy resin; NMA identifies methyl-endomethylene tetrahydrophthalic anhydride (nadic methyl anhydride); and the remainder of the components are as identified in the above examples.

TABLE 4-a

| Sample ID | P | Q | R | S | T |
|---|---|---|---|---|---|
| R91 | 75 | 75 | 75 | 75 | 75 |
| BisF | 25 | | | | |
| EHPE 3150 | | | 25 | | 25 |
| RAS1 | | 25 | | 25 | |
| MHHPA | 151 | 136 | 113 | | |
| NMA | | | | 132 | 121 |
| MY-24 | 1.0 | 1.0 | 1.0 | 1.0 | 1.0 |
| anhydride/ epoxy ratio | 1.0 | 1.0 | 1.0 | 0.9 | 1.0 |
| Cure: hours/° C. | 1/150 + 12/200 | 2/120 + 12/200 | 2/120 + 12/200 | 1/150 + 12/200 | 1/150 + 12/200 |
| Tg | 174 | 215–220 | 225 | 233 | 237 |

The formulations and Tg values for these formulations illustrate that by substituting the bifunctional BisF resin with a multifunctional resin such as R-1 or EHPE 3150, it is possible to increase the Tg at least 40° C.

Sample formulations S and T from Table 4-a were filled with wollastonite (calciumsilicate) and silica, respectively, and redesignated Samples U and V. The fillers were added by means of a vacuum high speed dissolver mixer. The formulations, Tgs, cure profiles, CTE, and viscosity are reported in Table 4-b.

TABLE 4-b

| Sample ID | U | V |
|---|---|---|
| Sample S | 100 | |
| Sample T | | 100 |
| wollastonite | 57 | |
| silica | | 57 |
| Cure: hours/° C. | 2/120 + 12/200 | 1/150 + 12/200 |
| Tg | 222 | 233 |
| CTE | 34 | 45 |
| Viscosity (Pa · s) | | |
| initial | 24 | 18 |
| after 6° C. for 97 days | 31 | 25 |

The data show that it is possible to prepare a low viscosity, one-part potting compound that shows good storage stability at 6° C.

STRUCTURES OF COMPOUNDS

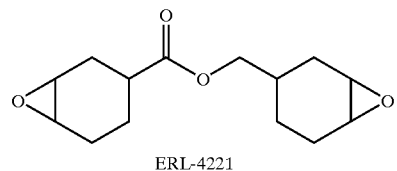

ERL-4221

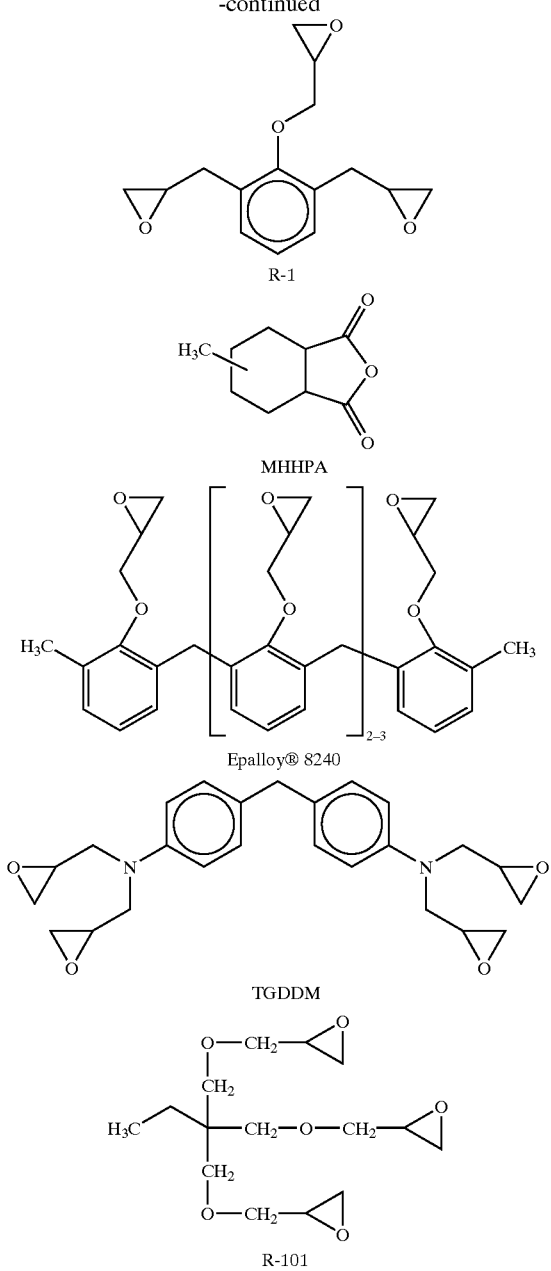
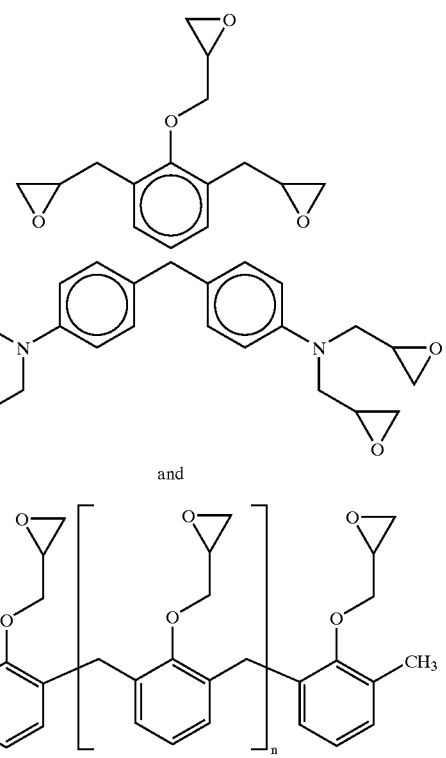

in which n is 2–3.

What is claimed:

1. An encapsulant or potting composition comprising
   (a) a cyclo-aliphatic epoxy, present in an amount of 50 to 80 parts by weight;
   (b) a multi-functional aromatic epoxy having more than two epoxy groups per molecule, present in an amount of 20 to 50 parts by weight;
   (c) a liquid anhydride, present in an amount of 80 to 150 parts by weight;
   (d) a basic latent accelerator, present in an amount of 1 to 5 parts by weight; and
   (e) a filler, present in an amount of 100 to 500 parts by weight;
   characterized in that either the cycloaliphatic epoxy or the multifunctional aromatic epoxy will be a liquid, the filled composition will have a viscosity within the range of 25 to 40 Pa.s, and upon cure the composition will be a solid having a coefficient of linear thermal expansion equal to or lower than $25 \times 10^{-6}$ $K^{-1}$, a glass transition temperature of 200° C. or greater, and a ratio of anhydride to epoxy equivalents within the range of 0.8–1.2.

2. The encapsulant or potting composition according to claim 1 in which the cycloaliphatic epoxy is 3,4-epoxycyclo-hexylmethyl-3,4-epoxy-cyclohexane carboxylate.

3. The encapsulant or potting composition according to claim 1 in which the multifunctional aromatic epoxy is selected from the group of epoxies having the following structures:

in which n is 2–3.

4. The encapsulant or potting composition according to claim 1 in which the anhydride is methylhexahydrophtalic anhydride or methyl-endomethylene tetrahydrophthalic anhydride.

5. The encapsulant or potting composition according to claim 1 in which the filler is selected from the group consisting of carbon black, graphite, gold, silver, copper, platinum, palladium, nickel, aluminum, silicon carbide, boron nitride, diamond, alumina, vermiculite, mica, wollastonite, calcium carbonate, titania, sand, glass, fused silica, fumed silica, barium sulfate, tetrafluoroethylene, trifluoroethylene, vinylidene fluoride, vinyl fluoride, vinylidene chloride, and vinyl chloride.

6. The encapsulant or potting composition according to claim 5 in which the filler is wollastonite.

* * * * *